United States Patent
Love et al.

(10) Patent No.: US 6,168,971 B1
(45) Date of Patent: Jan. 2, 2001

(54) METHOD OF ASSEMBLING THIN FILM JUMPER CONNECTORS TO A SUBSTRATE

(75) Inventors: David G. Love, Pleasanton; Patricia R. Boucher, Fremont; David A. Horine, Los Altos, all of CA (US)

(73) Assignee: Fujitsu Limited (JP)

( * ) Notice: Under 35 U.S.C. 154(b), the term of this patent shall be extended for 0 days.

(21) Appl. No.: 09/072,806

(22) Filed: May 5, 1998

(51) Int. Cl.[7] .......................... H01L 21/44; H01L 21/48; B23K 1/00; B23K 5/00; G01C 15/00
(52) U.S. Cl. .......................... 438/108; 438/106; 228/6.2; 33/286
(58) Field of Search ...................... 438/106, 108, 438/464, 455; 33/286; 228/6.2, 180.22

(56) References Cited

U.S. PATENT DOCUMENTS

| | | | |
|---|---|---|---|
| 3,713,575 | 1/1973 | Cushman | 228/6.29 |
| 3,923,584 | 12/1975 | Hojo et al. | 156/379 |
| 3,982,979 | 9/1976 | Hentz et al. | 156/73.6 |
| 4,180,828 | 12/1979 | Schermer et al. | 357/79 |
| 4,404,741 | 9/1983 | Lebet et al. | 29/721 |
| 4,558,812 | 12/1985 | Bailey et al. | 228/180.1 |
| 4,893,403 | 1/1990 | Heflinger et al. | 29/840 |
| 4,899,921 | * 2/1990 | Bendat et al. | 228/105 |
| 5,042,709 | 8/1991 | Cina et al. | 228/105 |
| 5,090,609 | 2/1992 | Nakao et al. | 228/123 |

(List continued on next page.)

OTHER PUBLICATIONS

Semiconductor Equipment Corporation, Internet Information Sheet on Model 410 Flip Chip Die Bonder, http://www.semicorp.com/410.htm.*

Research Devices Inc. Flip–chip bonders, Si–Coast Internet Information Sheets. http://www.sicoast.com/new/products.html.*

Karl Suss FC!%) Chip Bonder, Internet Information Sheet from Semicon West '99, http://www.suss.com/report/v15/page4.htm.*

Primary Examiner—Son T. Dinh
Assistant Examiner—Adam Pyonin
(74) Attorney, Agent, or Firm—Coudert Brothers

(57) ABSTRACT

A method of assembling thin film jumper connectors to a substrate as part of a process of manufacturing a multi-chip-module or other device having multiple components bonded to chip carrier or other substrate. An alignment plate is positioned on the chuck of a standard flip-chip bonding machine. The thin film jumper connectors are placed on the alignment plate in a face-up position after alignment to alignment marks on the plate using the machine's moveable platform and split-field viewer. The jumper connectors are held to the alignment plate by a force supplied by the vacuum system of the flip-chip bonder, with the force being transmitted to the jumpers through vacuum holes in the alignment plate. The plate's alignment marks are positioned so that when they are aligned with corresponding marks on the connectors, the bonding pads on the connectors are correctly aligned to the pads on the substrate. The substrate or chip carrier is then placed on the moveable platform and rotated to a face-down position. The substrate is moved into a coarse position over the thin film connectors, aligned with the split-field viewer, and then lowered into contact with the contacts of the connectors. The entire assembly, including the alignment plate is then placed in a reflow furnace or otherwise heated to cause the solder bumps on the thin film connector pads to make good electrical contact with the bonding pads on the substrate. Depending on the thermal relationships between the integrated circuit chips, the thin film connectors, and the substrate, the chips may be connected to the substrate either before or after the thin film jumper connectors are bonded to the substrate. If the chips are connected prior to the assembly of the thin film connectors, then a chip cavity is formed in the alignment plate to prevent contact between the chips and the bonding apparatus during the thin film connector bonding.

18 Claims, 3 Drawing Sheets

U.S. PATENT DOCUMENTS

| | | | |
|---|---|---|---|
| 5,212,880 | 5/1993 | Nishiguchi et al. | 29/739 |
| 5,236,118 | 8/1993 | Bower et al. | 228/193 |
| 5,370,301 | 12/1994 | Belcher et al. | 228/180.22 |
| 5,372,294 | 12/1994 | Gore et al. | 228/105 |
| 5,399,898 | 3/1995 | Rostoker | 257/499 |
| 5,427,301 * | 6/1995 | Pham et al. | 228/110.1 |
| 5,460,320 | 10/1995 | Belcher et al. | 228/180.22 |
| 5,462,217 * | 10/1995 | Simmons et al. | 228/180.22 |
| 5,766,984 * | 6/1998 | Ramm et al. | 438/109 |
| 5,858,814 * | 1/1999 | Goosen et al. | 438/107 |
| 5,891,354 * | 4/1999 | Lee et al. | 216/99 |
| 5,936,847 * | 8/1999 | Kazle | 361/771 |
| 6,016,256 * | 1/2000 | Crane, Jr. et al. | 361/813 |

* cited by examiner

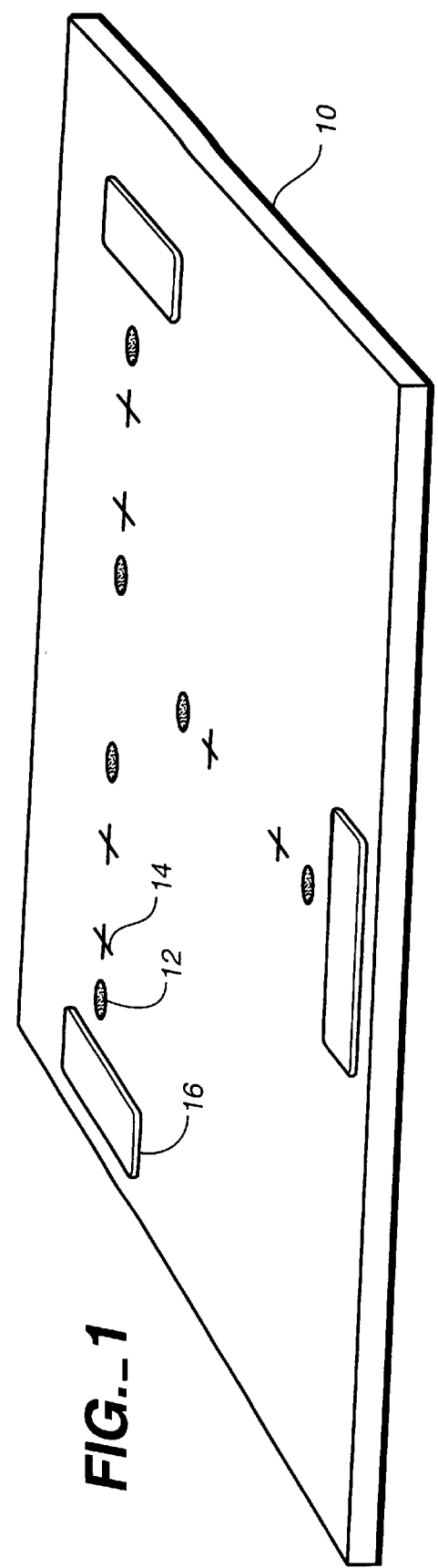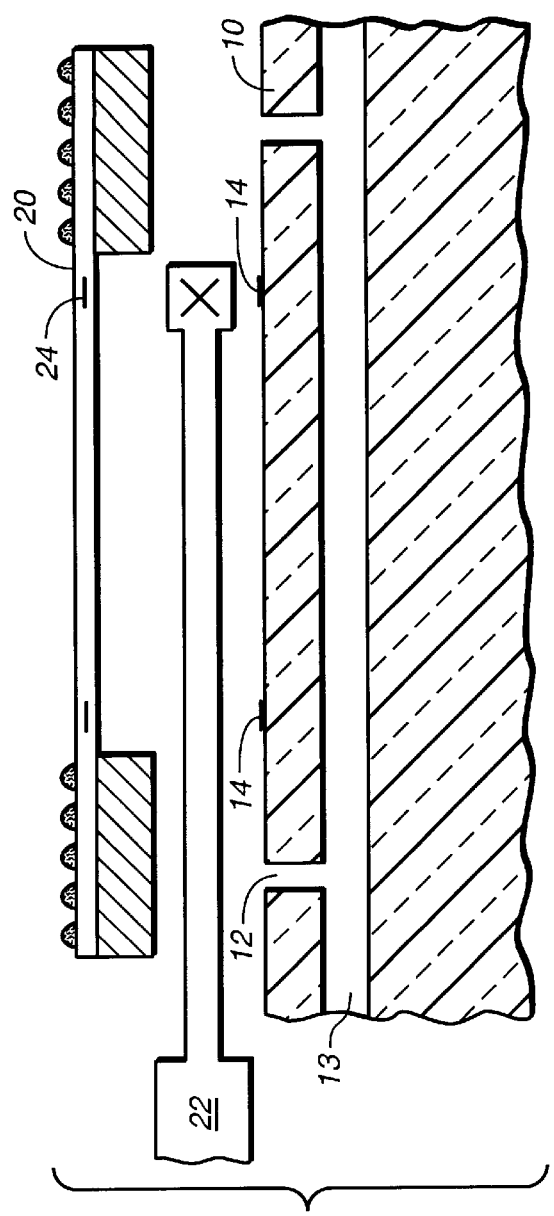

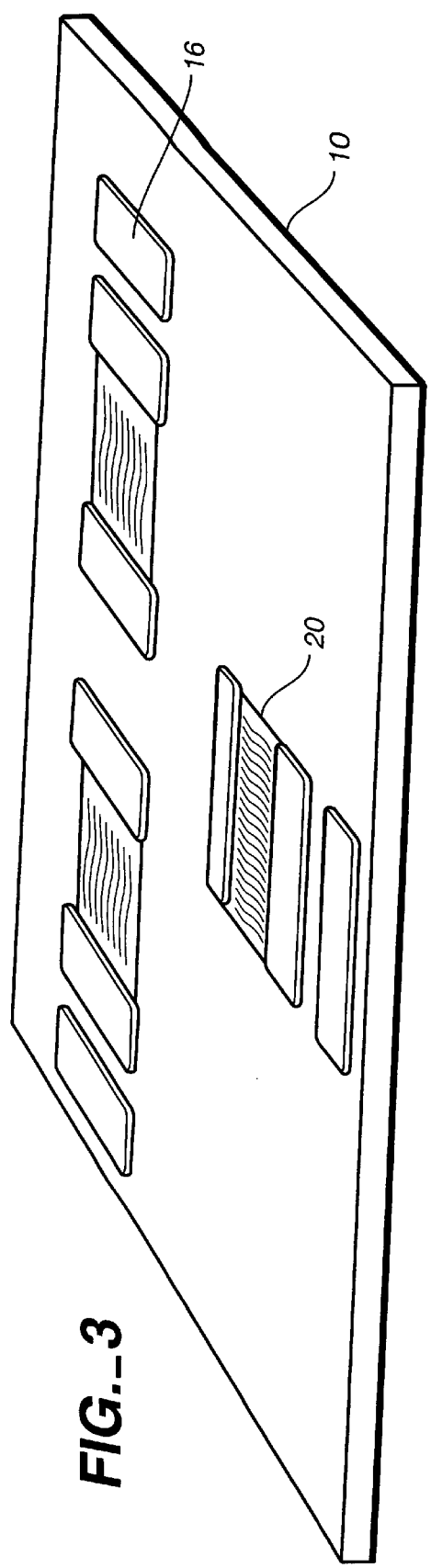
FIG._3
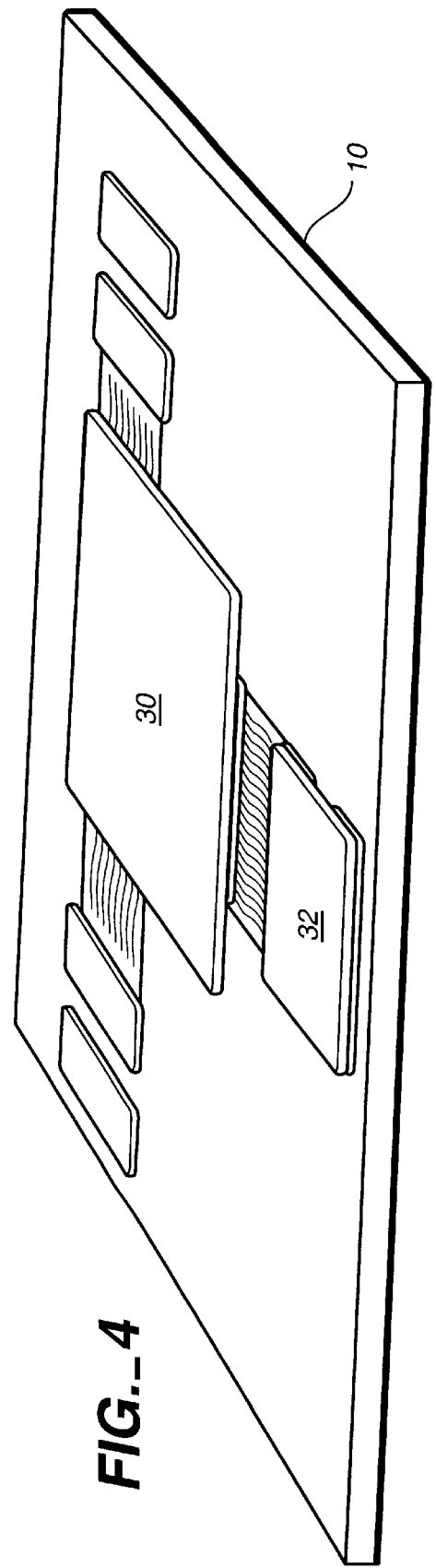
FIG._4

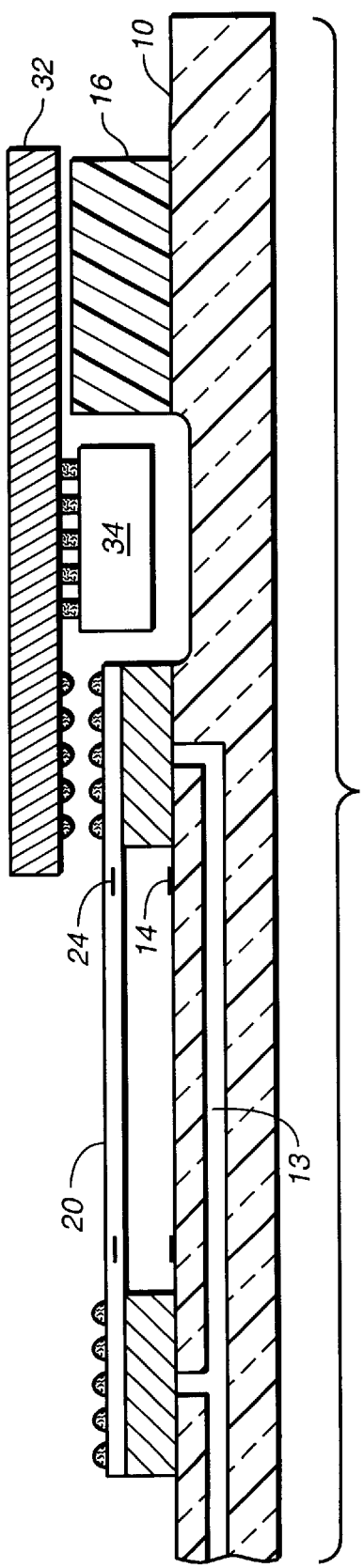
FIG._5
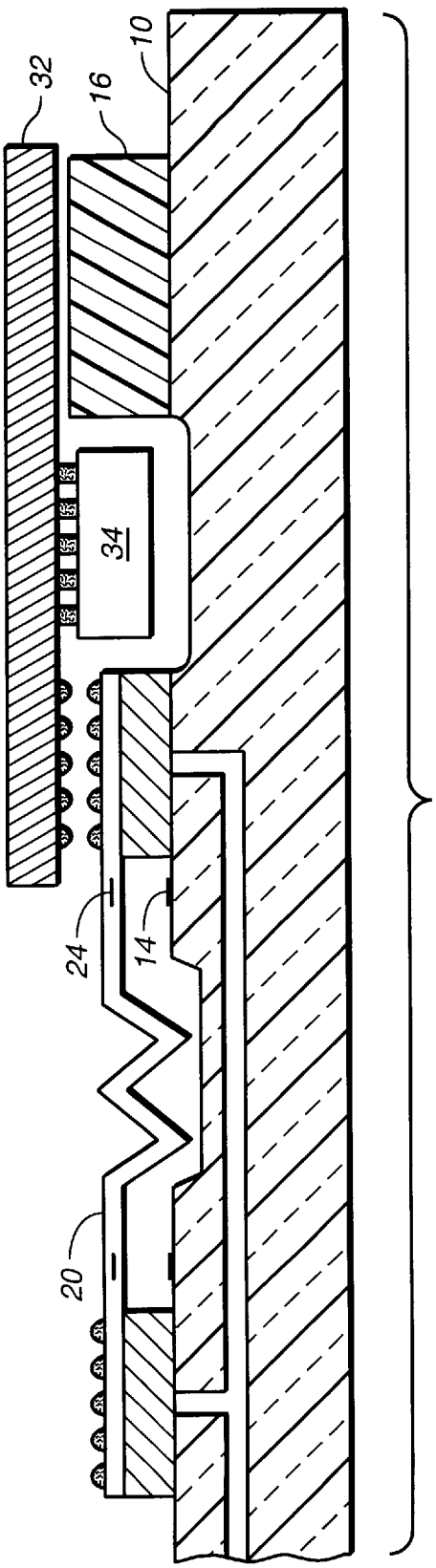
FIG._6

METHOD OF ASSEMBLING THIN FILM JUMPER CONNECTORS TO A SUBSTRATE

TECHNICAL FIELD

The present invention relates to techniques for mounting multiple components on a substrate, and more specifically, to a method of assembling more than one properly aligned thin film jumper connector to a substrate using a standard flip-chip bonding machine which performs a single alignment operation at a time.

BACKGROUND OF THE INVENTION

Flip-chip bonding is a method of electrically connecting an integrated circuit chip or other component to a substrate, e.g., a chip carrier. The substrate typically includes bonding pads for the chip which may be connected by a set of conductive lines to contact pads for a package or to other bonding pads on the substrate. The conductive lines thus form an interconnect network or I/O path for multiple elements mounted on a common substrate. In flip-chip (or solder bump) bonding, solder bumps are placed on the pads of the chip. The chip is placed on a holder in a face-up position, flipped over (i.e., face-down) and aligned with the corresponding conductive bonding pads on the substrate. The solder is then reflowed, causing the bumps to fuse with the bonding pads and providing electrical connection between the chip's I/O pads and the substrate.

Standard flip-chip bonding equipment typically includes a chuck, a moveable assembly platform, and a split-field viewer. When bonding a chip to a chip carrier or substrate, for example, the substrate is placed on the chuck in a face-up position, and the chip is placed on the moveable platform in a face-up position. The platform is then rotated 180 degrees so that the chip is face-down. The chip is then moved into coarse alignment with the substrate, but separated from it by several millimeters. The split-field viewer is interposed between the chip and the substrate, and is used to provide the viewer with simultaneous views of the chip and the substrate. Using these views, the viewer aligns the solder bumps of the chip with the corresponding bonding pads of the substrate. Typically, each of the two components to be bonded has cross-hair alignment marks which are used for this precise alignment.

Once the chip and the substrate are correctly aligned, the split-field viewer is retracted and the assembly platform holding the chip is lowered to bring the chip's solder bumps into physical contact with the substrate's bonding pads. The solder bumps typically have a layer of solder flux formed over them, and when heated, the solder reflows, establishing good electrical contact between the chip and the substrate. Note that although in the example described, the solder bumps are on the chip's I/O or bonding pads, the solder bumps may instead be placed on the substrate bonding pads.

Standard flip-chip bonding machines are only intended to attach two components to each other during each flip-chip bonding operation. Thus, standard flip-chip machines are only capable of performing a single two-component alignment operation at a time and are not designed to perform the two or more simultaneous alignment operations required for the proper alignment and assembly of multiple components. The machines' design does not permit the simultaneous bonding of two or more components to a single substrate or chip carrier, an operation which is required, for example, when connecting multiple thin film jumper connectors to a substrate. One possible solution to this problem would be to use a custom bonding machine which has sufficient degrees of freedom to permit the simultaneous alignment of more than one component to a substrate. The disadvantage of this approach is the time and cost required to design and manufacture such a machine. Since standard flip-chip bonding machines are already installed at most device manufacturers, it would be more efficient to use such a machine if possible.

What is desired is a method of bonding multiple components to a substrate at the same time, while maintaining a desired alignment between the components and between the components and the substrate. It is further desired that the apparatus and method utilize a standard flip-chip bonding apparatus to perform the bonding operation.

SUMMARY OF THE INVENTION

The present invention is directed to a method of assembling more than one thin film jumper connector to a substrate at the same time, as part of a process of manufacturing a multi-chip module or other device in which multiple components are bonded to a chip carrier or other substrate. In accordance with the invention, an alignment plate is positioned on the chuck of a standard flip-chip bonding machine. The thin film jumper connectors are placed on the alignment plate in a face-up position. Precise alignment between alignment marks on the connectors and alignment marks on the plate is achieved using the machine's moveable platform and split-field viewer. The jumper connectors are held to the alignment plate by a force supplied by the vacuum system of the flip-chip bonder, with the force being transmitted to the connectors through vacuum holes in the alignment plate. The plate's alignment marks are positioned so that when they are aligned with the corresponding marks on the connectors, the bonding pads or solder bumps on the connectors are correctly aligned to the pads on the substrate(s) which will be bonded to the connectors. A substrate or chip carrier to be connected to the jumper connectors is then placed on the moveable platform in a face-up position and rotated to a face-down position. The substrate is moved into a coarse position over the thin film connectors, precisely aligned with the split-field viewer, and then lowered into physical contact with the pads or solder bumps of the connectors.

The entire assembly, including the alignment plate, is then placed in a reflow furnace or otherwise heated to cause the solder bumps on the thin film connector pads to make good electrical contact with the bonding pads on the substrate. Depending on the thermal relationships between the integrated circuit chips, the thin film connectors, and the substrate, the chips may be connected to the substrate either before or after the thin film jumper connectors are bonded to the substrate. If the chips are connected prior to the assembly of the thin film connectors, then a chip cavity is formed in the alignment plate to prevent contact between the chips and the bonding apparatus during the thin film connector bonding. In such a situation, the melting point of the solder bumps used to bond the chip(s) to the substrate should be substantially higher than that of the bumps used to bond the thin film connectors to the substrate.

BRIEF DESCRIPTION OF THE DRAWINGS

FIG. 1 is a plan view of the alignment plate which is used as part of the method of assembling thin film jumper connectors to a substrate of the present invention.

FIG. 2 is a side view showing how the thin film jumper connectors are aligned to the alignment plate of FIG. 1 as part of the method of the present invention.

FIG. 3 is a plan view showing the placement of a plurality of thin film jumper connectors on the alignment plate of FIG. 1.

FIG. 4 is a plan view showing a substrate or substrates aligned to the thin film jumper connectors and alignment plate assembly of FIG. 3 using the method of the present invention.

FIG. 5 is a side view showing the completed substrate or chip carrier, chip, and thin film jumper connector assembly constructed according to the method of the present invention.

FIG. 6 is a side view showing an embodiment of the completed assembly of FIG. 5 which includes a cavity in the alignment plate for protection of a "kinked" thin film jumper connector.

DETAILED DESCRIPTION OF THE PREFERRED EMBODIMENT

The present invention pertains to a method of attaching multiple components to a substrate using a standard flip-chip bonding machine which is capable of performing only a single two-component alignment operation at a time. The invention will be described in the context of an example directed to the attachment of multiple thin film jumper connectors (TFJCs) to a substrate during the assembly of a multi-chip module (MCM). It is to be understood that the inventive method is not limited to this example and may be used to attach other types of components to each other using standard flip-chip bonders in situations where multiple components must be properly aligned with respect to each other.

Some mass produced MCMs utilize TFJCs to electrically connect the I/O pads of an integrated circuit chip to pads or bumps of the package in which the chip is encased, or to connect the I/O pads of multiple chips to each other. These applications of TFJCs require the proper alignment of multiple substrates to the TFJCs and to each other. The chip or chips are typically mounted on their respective substrate(s) using flip-chip bonding techniques. The TFJCs must be properly aligned with the I/O or other interconnect pads of the substrate(s). Thus, assembly of the completed package requires that a plurality of components be properly aligned with respect to each other at substantially the same time. However, this is difficult to achieve using present day assembly techniques. This is because currently used flip-chip bonding machines are only capable of performing a single alignment operation at a time, instead of the multiple, simultaneous alignment operations required. Another problem encountered in the assembly of packages which include TFJCs is that the connectors, substrate, and chip must maintain their respective positions and alignments during transportation of the components to a reflow furnace or other heat source used to melt the solder bumps and electrically bond the components together.

In accordance with the present invention, a method is disclosed which overcomes the disadvantages noted in the production of multi-chip-modules which use thin film jumper connectors. The present invention utilizes standard flip-chip alignment and bonding methods and machinery, and thus does not require the design and manufacture of a customized piece of equipment. Thus, the present invention is well suited to the mass production of MCMs in which multiple substrates are interconnected by thin film jumper connectors.

An important aspect of the present invention is the use of an alignment plate or mask which is placed on the chuck of a standard flip-chip bonding machine. Vacuum hole(s) in the alignment plate are used in conjunction with the bonding machine's vacuum system to provide a force to hold a component or components to the plate. The alignment plate also includes alignment mark(s) which, in conjunction with associated marks on the TFJCs, assist in the proper placement of the TFJCs relative to each other and to the substrates on which the integrated circuit chips are mounted. After proper placement of the TFJCs in a face-up position on the alignment plate using the split-field viewer of the flip-chip bonding machine, the substrate or substrates are aligned face-down to the TFJCs, using the split-field viewer of the flip-chip machine. The entire assembly, including the alignment plate is then moved to a reflow furnace to permit melting and reflow of the solder bumps on the various components.

FIG. 1 is a plan view of the alignment plate (or mask) 10 which is used as part of the method of assembling thin film jumper connectors to a substrate of the present invention. As indicated in the figure, alignment plate 10 typically has a plurality of vacuum holes 12 (e.g., 1 mm in diameter) drilled through it for purposes of holding components placed on the plate to the plate (and hence to the chuck of a flip-chip bonding machine). The bonding machine typically includes a vacuum system capable of supplying a vacuum force for holding a component to a surface. One side of alignment plate 10 may include structures or alignment marks for assisting in proper placement of plate 10 on the chuck of the bonding machine. Plate 10 may also include a channel or channels (not shown) on its underside which provide a way of transmitting the vacuum force supplied by the bonding machine to vacuum holes 12 of plate 10.

Alignment plate 10 also includes two or more alignment marks 14 which are used in conjunction with corresponding marks in the TFJCs to indicate the proper position of the TFJCs relative to the plate. Alignment marks 14 are placed in the positions required for the TFJCs to be correctly aligned to the bonding pads of the chips for the particular MCM being assembled. In addition, if needed, plate 10 includes shim(s) 16 which are used to provide support for the substrate on which a chip is mounted and proper separation between a substrate-chip assembly and the plate. In the example described, shims 16 are of substantially the same height as a TFJC. Shims 16 may be glued to plate 10, or attached by other suitable methods compatible with processing of the MCM. Note that as shown in the figure, in a typical application of the present invention, alignment plate 10 will have at least one vacuum hole and alignment mark associated with each component which is to be bonded to a substrate. Alignment marks 14 may be placed so that they signify the edges of a component to be placed on plate 10, so that they indicate where the center of a component is to be placed, so that they indicate where a corresponding alignment mark or marks on a component should be aligned, or another suitable configuration. Similarly, the number and location of vacuum holes 12 may be determined by the edges or number of components to be bonded to the substrates, or any other suitable factor(s).

Note that another possible embodiment of alignment plate 10 is one which includes a set of alignment marks defining progressively larger locations for the placement of components on the plate. The set of marks could, for example, define the boundaries or specific edges for a generic set of typical component sizes. Such a "universal" alignment plate would be capable of being used in the assembly of different sized components to substrates, without the need to have a plate produced for a specific, predetermined set of components.

Alignment plate 10 may be made of glass or another suitable material. Glass or a similarly transparent or semi-transparent material is desirable for fabrication of plate 10 because it assists in properly aligning plate 10 to the chuck (and, if applicable, the vacuum ports or coupling structures) of the flip-chip bonding machine by permitting vision through the plate to any alignment marks or guides on the chuck. Other benefits of using glass are that it can be formed into a very flat plate and provides good contrast with the alignment marks. While these features may make the process of correctly positioning the plate easier, it is noted that opaque materials may also be used to fabricate the plate. In such a situation, chuck alignment structures may be fabricated in the underside of the plate.

As noted, alignment plate 10 is positioned onto the chuck of a flip-chip bonding machine in a manner so that the vacuum system of the machine can supply a holding force through vacuum hole(s) 12 of plate 10. A TFJC is then placed face-down (i.e., solder bumps down) on the moveable platform of the bonding machine. The platform is then rotated 180 degrees. Using the moveable platform and split-field viewer of the flip-chip machine, each thin film jumper connector (or other component) is precisely aligned to, and placed face-up on, plate 10. Proper alignment between each TFJC and plate 10 is indicated by the matching of alignment mark(s) in the TFJC and alignment mark(s) 14 of plate 10. Typically, the alignment marks for the TFJCs are placed in the bottom layer of the connectors so that they can be seen by a split-field viewer from the non-bump side of the connectors through the polymeric layer. FIG. 2 is a side view showing how the thin film jumper connectors 20 are aligned to alignment plate 10 of FIG. 1 as part of the method of the present invention. As indicated by the figure, after coarse alignment of TFJC 20 to plate 10, split-field viewer 22 is used to correctly position TFJC 20 relative to plate 10. As noted, this is done by matching alignment mark(s) 24 of TFJC 20 to the corresponding marks 14 of plate 10. After precise positioning of TFJC 20 relative to plate 10, viewer 22 is retracted, and TFJC 20 is lowered into physical contact with plate 10. The vacuum force supplied from the chuck through vacuum hole(s) 12 is used to hold TTJC 22 to plate 10 and hence to the chuck of the flip-chip bonding machine.

As shown in FIG. 2, a channel 13 is formed in plate 10 and serves to connect vacuum holes 12 so that the vacuum or holding force supplied through the chuck of the flip-chip bonding machine is transmitted to the holes. Note that for the example of placing TFJCs on plate 10 shown in the figure, alignment marks 14 and 24 are positioned away from the area in which the TFJC will contact the alignment plate. This is done so that the repeated placement of a TFJC 20 onto plate 10 will not wear out or otherwise reduce the effectiveness of the marks. The process of placing a TFJC on the bonding machine's platform and precisely aligning it to mark(s) on the alignment plate is repeated for each TFJC or other component. It is noted that alignment marks 14 of plate 10 are placed so that the bonding pads of TFJC 20 are collectively aligned to the corresponding pads of the substrate or substrates which are to be bonded to the TFJCs. FIG. 3 is a plan view showing the placement of a plurality of thin film jumper connectors 20 on alignment plate 10 of FIG. 1.

After alignment and placement of the thin film jumper connectors on alignment plate 10, the substrates on which the integrated circuit chips (or other components) are attached and aligned to the jumper connectors. This is done by placing a substrate face up onto the moveable platform of the flip-chip bonding machine, rotating the platform 180 degrees, and using the split-field viewer to correctly position the face-down substrate over the jumper connector(s). The substrate is then lowered so that its bonding pads (or solder bumps) are in physical contact with those of the jumper connector. A tacky solder flux may be used to keep the substrate in place. It is noted that a high-temperature tack bond is generally not used because differential expansion can result in misalignment of the components. The process of substrate to TFJC alignment is repeated for each substrate or other component.

FIG. 4 is a plan view showing a substrate 30 (or substrates) correctly aligned to the thin film jumper connectors and alignment plate of FIG. 3 using the method of the present invention. Note that FIG. 4 shows additional substrates 32 aligned to TFJCs 20. Additional substrates 32 may contain integrated circuit chips or other components which are to be interconnected to substrate 30 (and hence the chip mounted on it) by means of connectors 20. After proper positioning of the substrates, the entire assembly, including alignment plate 10 is removed from the flip-chip machine chuck and placed in a reflow furnace. This causes the solder bumps on the bonding pads of the components to melt and provide good electrical connection between the components. Solder flux removal using a solvent or aqueous cleaner may follow the soldering operation.

FIG. 5 is a side view showing a completed substrate or chip carrier 32, integrated circuit chip 34, and thin film jumper connector 20 assembly constructed according to the method of the present invention. As shown in the figure, IC chip 34 is aligned and mounted to substrate 32. The chip and substrate assembly is aligned and bonded to TFJC 20. Shim 16 placed on alignment plate 10 is used to support substrate 32 so that its bonding pads are properly positioned with respect to those of TFJC 20. After completion of the described assembly steps, alignment plate 10 is removed and any other testing and processing of the assembly required to complete the MCM is performed. Although alignment plate 10 is pictured in FIG. 5 as being formed from glass, other materials may be used. The materials may be transparent, semi-transparent, or opaque. In any case, the material used to form plate 10 must be capable of being subjected to the temperatures and processes required during the assembly of the MCM or other device without suffering significant warping or damage.

Note that depending on the thermal relationships between the integrated circuit chips, the thin film connectors, and the substrate(s), the chips may be connected to the substrate(s) either before or after the thin film jumper connectors are bonded to the substrate(s). If the chips are connected prior to the assembly of the thin film connectors, then a chip cavity (as shown in FIG. 5) is formed in the alignment plate to prevent contact between the chips and the bonding apparatus during the thin film connector bonding. In such a situation, the melting point of the solder bumps used to bond the chip(s) to the substrate should be substantially higher than that of the bumps used to bond the thin film connectors to the substrate to avoid any remelting of chip connections during subsequent reflow. If the chips are connected to the substrate(s) after assembly of the TFJCs to the substrate(s), then the alignment plate is removed, the assembly turned over, and the chips then bonded to the substrate(s).

FIG. 6 is a side view showing an embodiment of the completed assembly of FIG. 5 which includes a cavity in the alignment plate for protection of a "kinked" thin film jumper connector. As shown in the figure, in some applications the TFJC used may be "kinked", i.e., containing a number of bends. In such a case, a cavity may be formed in the alignment plate to accommodate the kinked connector and prevent it from being damaged during the assembly of the TFJCs and substrates.

A method of assembling multiple components to one another in the proper alignment has been described. The method utilizes a standard flip-chip bonding machine which is capable of performing a single alignment operation at a time. An alignment plate or mask is used in conjunction with the flip-chip bonder to permit the precise alignment of multiple components with respect to each other. This results in an assembly method which is well suited to the mass production of multi-chip modules or other multiple component devices.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

What is claimed is:

1. A method of assembling multiple components to a substrate, each of said components having a first surface, a second surface opposite to the first surface, and a set of bonding pads disposed on the component's first surface, the substrate having a first surface, a second surface opposite to the first surface, and two or more sets of bonding pads disposed on the substrate's first surface, each set of the substrate's bonding pads for mating with a corresponding set of bonding pads of a component, said method comprising:

providing an alignment plate having a first alignment mark for a first component and a second alignment mark for a second component;

aligning the first component to the first alignment mark with the second surface of the first component disposed against the alignment plate;

aligning the second component to the second alignment mark with the second surface of the second component disposed against the alignment plate;

substantially simultaneously aligning the substrate to the first and second components by the steps of viewing the first surfaces of the substrate and at least one of the components simultaneously and aligning the sets of bonding pads on the substrate to corresponding sets of bonding pads on the components by moving the substrate and the alignment plate relative to one another while viewing the first surfaces of the substrate and the at least one component; and electrically connecting the bonding pads of the first component to the corresponding bonding pads of the substrate and electrically connecting the bonding pads of the second component to the corresponding bonding pads of the substrate.

2. The method of claim 1, wherein the alignment plate further comprises:

a vacuum hole in the alignment plate to permit a vacuum force to be transmitted through the plate to a component placed on the plate.

3. The method of claim 1, wherein the step of substantially simultaneously aligning the substrate to the first and second components further comprises:

aligning bonding pads on the substrate to bonding pads on the first and second components using a split-field viewer.

4. The method of claim 1, wherein the step of electrically connecting the first component to the substrate and electrically connecting the second component to the substrate further comprises:

heating solder bumps on the first component, second component, or substrate to cause the solder bumps to reflow and produce a bond between bonding pads on the first component and the substrate and between the second component and the substrate.

5. The method of claim 1, wherein the first component comprises a thin film jumper connector.

6. The method of claim 1, wherein the second component comprises a thin film jumper connector.

7. The method of claim 1, wherein the substrate comprises a chip carrier.

8. The method of claim 7, wherein the chip carrier has an integrated circuit chip bonded to it.

9. The method of claim 1, wherein the first component includes a first component alignment mark, and the step of aligning the first component to the first alignment mark further comprises:

interposing a split-field viewer between the first component and the alignment plate; and using the split-field viewer to align the first component alignment mark to the first alignment mark.

10. The method of claim 9, wherein the second component includes a second component alignment mark, and the step of aligning the second component to the second alignment mark further comprises:

interposing a split-field viewer between the second component and the alignment plate; and using the split-field viewer to align the second component alignment mark to the second alignment mark.

11. The method of claim 1, wherein the alignment plate is formed from glass.

12. A method of assembling multiple components to a substrate using a flip-chip bonding machine, the machine including a chuck, a moveable platform, and a split-field viewer, the method comprising:

placing an alignment plate on the chuck of the flip-chip bonding machine, the alignment plate having a first alignment mark for a first component and a second alignment mark for a second component;

aligning a first component to the first alignment mark using the split-field viewer;

aligning a second component to the second alignment mark using the split-field viewer;

arranging the substrate on the moveable platform of the flip-chip bonding machine;

substantially simultaneously aligning the substrate to the first component and the second component using the split-field viewer; and electrically connecting the first component to the substrate and electrically connecting the second component to the substrate.

13. The method of claim 12, wherein the alignment plate further comprises:

a vacuum hole in the alignment plate to permit a vacuum force to be transmitted through the plate to a component placed on the plate.

14. The method of claim 12, wherein the first component includes a first component alignment mark, and the step of aligning the first component to the first alignment mark further comprises:

interposing the split-field viewer between the first component and the alignment plate; and using the split-field viewer to align the first component alignment mark to the first alignment mark.

15. The method of claim 12, wherein the second component includes a second component alignment mark, and the step of aligning the second component to the second alignment mark further comprises:

interposing the split-field viewer between the second component and the alignment plate; and using the split-field viewer to align the second component alignment mark to the second alignment mark.

16. The method of claim 12, wherein the step of electrically connecting the first component to the substrate and electrically connecting the second component to the substrate further comprises:

heating solder bumps on the first component, second component, or substrate to cause the solder bumps to reflow and produce a bond between bonding pads on the first component and the substrate and between bonding pads on the second component and the substrate.

17. A method of simultaneously assembling the top surfaces of a first component and a second component to the top surface of a substrate using a flip-chip bonding machine, each of the components and substrate having respective top surfaces and bottom surfaces, each of said components having a set of bonding pads disposed on the component's top surface, the substrate having two or more sets of bonding pads disposed on the substrate's top surface, each set of the substrate's bonding pads for mating with a corresponding set of bonding pads of a component, the machine having a chuck and a moveable platform, the method comprising the steps of:

placing an alignment plate on the chuck of the bonding machine, said alignment plate having a first alignment mark for the first component and a second alignment mark for the second component;

forming a third alignment mark on the bottom surface of the first component capable of being aligned to the first alignment mark on said plate, and forming a fourth alignment mark on the bottom surface of the second component capable of being aligned to the second alignment mark on said plate, said step including the step of positioning the alignment marks to provide a desired alignment of the components to the substrate;

placing each of the first and second components on said alignment plate with their bottom surfaces contacting said plate, said step including the step of aligning the third alignment mark to the first alignment mark and the step of aligning the fourth alignment mark to the second alignment mark;

placing the substrate on the moveable platform of the bonding machine with its bottom surface contacting the platform; and positioning the platform such that the top surface of the substrate substantially confronts the top surfaces of the first and second components and is in alignment to both of the components by the steps of viewing the top surfaces of the substrate and at least one of the components simultaneously and aligning the sets of bonding pads on the substrate to corresponding sets of bonding pads on the components by moving the substrate and the alignment plate relative to one another while viewing the top surfaces of the substrate and the at lease one component.

18. The method of claim 17, further comprising the steps of:

forming a fifth alignment mark on the top surface of the substrate capable of being aligned to an alignment mark on the top surface of the first component; and forming a sixth alignment mark on the top surface of the first component capable of being aligned to the fifth alignment mark on the substrate, wherein the step of positioning the platform comprises the step of aligning the fifth and sixth alignment marks.

* * * * *